United States Patent
Martinez et al.

(10) Patent No.: US 7,972,922 B2
(45) Date of Patent: Jul. 5, 2011

(54) METHOD OF FORMING A SEMICONDUCTOR LAYER

(75) Inventors: Hunter J. Martinez, Austin, TX (US); John J. Hackenberg, Austin, TX (US); Jill Hildreth, Austin, TX (US); Ross E. Noble, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 153 days.

(21) Appl. No.: 12/275,659

(22) Filed: Nov. 21, 2008

(65) Prior Publication Data

US 2010/0129952 A1    May 27, 2010

(51) Int. Cl.
    *H01L 21/8238*    (2006.01)
(52) U.S. Cl. ............... 438/226; 257/E21.461
(58) Field of Classification Search ............ 438/41–47, 438/197, 199, 226, 245, 269, 357–363, 413–416, 438/218, 225; 257/E21.092, E21.108, E21.461
    See application file for complete search history.

(56) References Cited

U.S. PATENT DOCUMENTS

| 6,451,660 | B1 | 9/2002 | Ma et al. |
| 6,947,642 | B2 | 9/2005 | Yamazaki |
| 7,187,059 | B2 | 3/2007 | Chan et al. |
| 7,250,085 | B2 | 7/2007 | Abbadie et al. |
| 7,396,743 | B2 | 7/2008 | Singh et al. |
| 7,537,658 | B2 | 5/2009 | Nasu et al. |
| 2008/0138917 | A1* | 6/2008 | Verhaverbeke et al. ........ 438/16 |

FOREIGN PATENT DOCUMENTS

| JP | 2006-179831 | A | 7/2006 |
| JP | 2006179831 | A * | 7/2006 |
| JP | 2007250837 | | 9/2007 |
| JP | 4292872 | B2 | 7/2009 |
| KR | 1020030052817 | | 6/2003 |
| KR | 1020070091470 | | 9/2007 |

OTHER PUBLICATIONS

PCT Application No. PCT/US2009/063121 International Search Report and Written Opinion, published May 27, 2010.

* cited by examiner

*Primary Examiner* — Brook Kebede

(57) ABSTRACT

A method of forming a semiconductor layer, which in one embodiment is part of a photodetector, includes forming a silicon shape, applying ozonated water, removing the first oxide layer at a temperature below 600 degrees Celsius, and epitaxially growing germanium. The silicon shape has a top surface that is exposed. The ozonated water is applied to the top surface and causes formation of a first oxide layer on the top surface. The germanium is grown on the top surface.

19 Claims, 4 Drawing Sheets

METHOD OF FORMING A SEMICONDUCTOR LAYER

BACKGROUND

1. Field

This disclosure relates generally to forming a semiconductor layer, and more specifically, to epitaxially growing a semiconductor layer that may be used, for example, in a photodetector.

2. Related Art

Some devices, such as photodetectors, are formed by epitaxially growing germanium over a silicon layer. It is important that the interface between the germanium and silicon is clean. If the interface is not clean then epitaxial growth is impeded and device performance is degraded. One approach to form a clean interface between the germanium and silicon involves thermally baking the substrate before forming the germanium at temperatures greater than approximately 800 degrees Celsius while flowing hydrogen gas. However, this temperature can damage the underlying silicon layer. In addition, if the photodetector is integrated with transistors on the substrate, the transistor, which are already formed, cannot withstand such a high temperature. Hence, a need exists for forming a clean interface between the germanium and silicon without the negative effects of the prior art method.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a semiconductor material, such as silicon, is exposed. The surface is treated by an iterative process that includes an insitu HF etch and a wet oxide growth steps, which can be repeated any number of times, including not repeating these steps. Afterwards, an HF clean is performed to remove any remaining oxide and to terminate the semiconductor materials bonds so that a native oxide is not formed when the semiconductor material is exposed to atmosphere. A different semiconductor material, such as germanium, is then epitaxially grown on the semiconductor material. In one embodiment, the semiconductor material, such as germanium, is epitaxially grown. The resulting epitaxial grown material is a high quality film as it does not have many contaminates and the dark current, which is current that flows when no light is provided to the optical device, is sufficiently low. In one embodiment, all of these processes are performed at temperatures less than 600 degrees Celsius, or more specifically 500 degrees Celsius.

Figure 1:
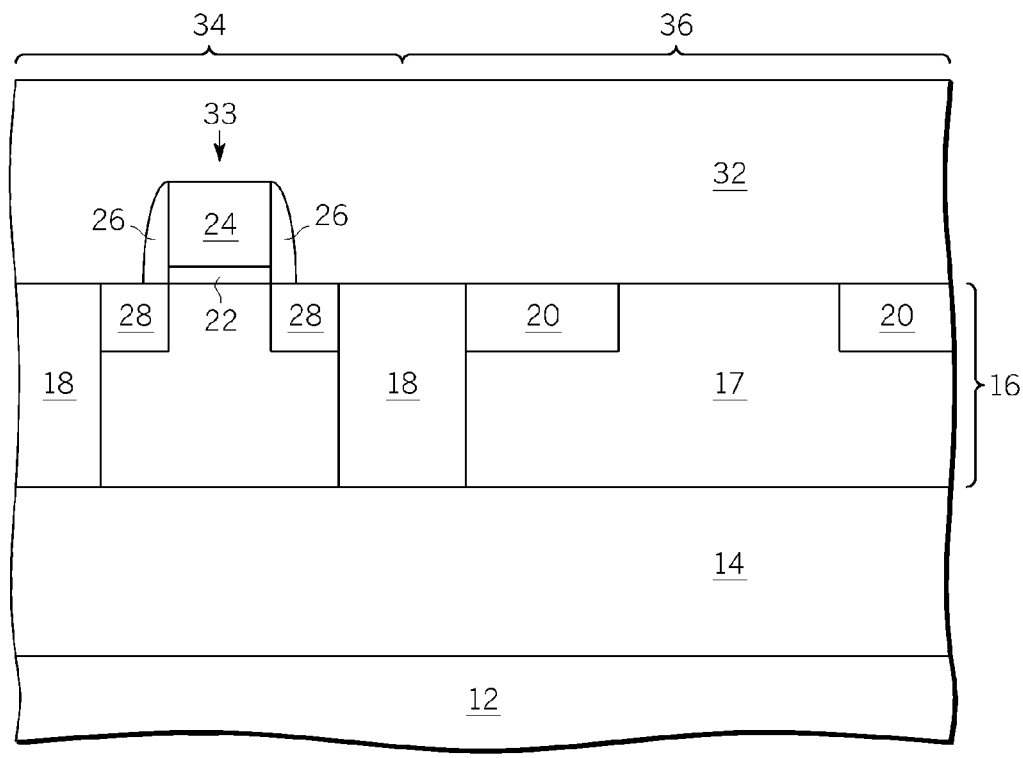
FIG. 1 illustrates a portion of a cross-section of semiconductor device including a transistor region and a photodetector region in accordance with an embodiment.

FIG. 1 illustrates a portion of a cross-section of semiconductor device or workpiece 10 including a transistor region 34 and a photodetector region 36 in accordance with an embodiment. In one embodiment, the semiconductor device 10 includes a silicon-on-insulator (SOI) substrate that includes a first silicon layer 12, a buried oxide (BOX) layer 14, and a second silicon layer 16. In other embodiments, the semiconductor substrate include semiconductor material or combinations of materials, such as gallium arsenide, silicon germanium, silicon-on-insulator (SOI), silicon, monocrystalline silicon, the like, and combinations of the above. In one embodiment, the first silicon layer 12 is a silicon substrate, the BOX layer 14 is approximately 800 nm of silicon dioxide, and the second silicon layer 16 is approximately 310 nm of silicon. Within the second layer 16 are first shallow trench isolation (STI) regions 18 and second shallow trench isolation (STI) regions 20, which in one embodiment are ultra shallow trench isolation (STI) regions. In the embodiment illustrated, the first STI regions 18 extend through the entire second silicon layer 16 and hence are approximately 310 nm in height. In the embodiment illustrated, the second STI regions 20 are more shallow than the first STI regions 18 and are approximately 160 nm in height. Between the first STI regions 18 within the transistor region 34 is a transistor 33 that includes a gate electrode 24, a gate dielectric 22, spacers 26, and source/drain regions 28. The gate electrode 24 may include any conductive material such as polysilicon, a metal gate, or combinations of the above. The gate dielectric 22 can include any dielectric such as silicon dioxide, a high dielectric constant material (e.g., hafnium oxide), or combinations of the above. The spacers 26 may include any insulative material such as silicon nitride. The source/drain regions 28 can be formed using any dopants, such as boron or phosphorus. The first STI regions 18 are used for electrical isolation. Between the second STI regions 20, which are used for optical isolation, and within the photodetector region 36 is formed a rib wave guide 17. In one embodiment, the rib wave guide 17 is an inverse-T shape.

After forming the transistor 33 in the transistor region 34, a semiconductor protective layer 32 is formed. In other words after forming the gate electrode 24, gate dielectric 22, spacers 26, and source/drain regions 28, if present, of the transistor 33, the semiconductor protective layer 32 is formed and patterned. The semiconductor protective layer 32 may or may not be planarized. In one embodiment, the semiconductor protective layer 32 protects the second layer 16. The semiconductor protective layer 32 may have additional functions depending on what layers it includes because the semiconductor protective layer 32 may include many different layers. For example, protective layer 32 may include the dielectric layers that were used to form the spacers 26 and liner dielectrics that are left behind due to the use of a layer used to protect regions where it is undesirable to form a self-aligned silicide or silicide, which may be formed in the transistor region 34. In one embodiment, the material used to form the spacers 26 is 90 nm of plasma enhanced chemical vapor deposited (PECVD) silicon nitride, and the liner dielectric is 15 nm of PECVD undoped oxide. The presence or absence of dielectric layers depends on the particular processing integration being used.

The semiconductor protective layer 32 may be formed by any suitable process, such as a chemical vapor deposition (CVD), atomic layer deposition (ALD), physical vapor deposition (PVD), the like, and combinations of the above. In one embodiment, the semiconductor protective layer 32 is a silicon protective layer and includes a top layer that is silicon dioxide and a bottom layer of a different material. In one embodiment, the bottom layer includes silicon and nitrogen; for example, the bottom layer may be silicon nitride. In another embodiment, the semiconductor protective layer 32 only includes one material, such as silicon dioxide. It is desirable that the top layer or the entire semiconductor protective layer 32 is silicon dioxide if the second material to be formed for the optical device, such as a photodetector, is germanium, because silicon dioxide has good selectivity for the subsequent germanium formation process. In one embodiment, the first semiconductor protective layer is greater than approximately 50 nanometers thick.

Figure 2:
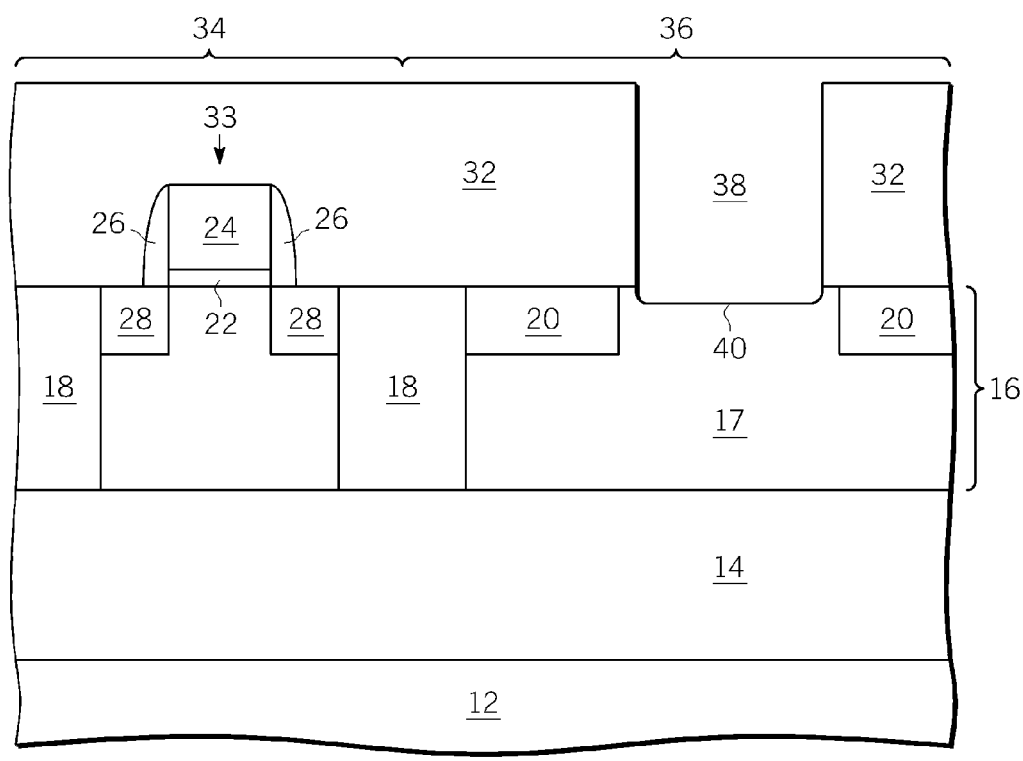
FIG. 2 illustrates the portion of the cross-section of the semiconductor device of FIG. 1 after forming a window in accordance with an embodiment.

FIG. 2 illustrates the portion of the cross-section of the semiconductor device of FIG. 1 after forming a window 38 in accordance with an embodiment. The first semiconductor protective layer 32 is patterned, using conventional patterning technique to form a window 38 and expose the rib wave guide 17. When forming the window 38, a portion of the rib wave guide 17 may be removed. The amount, if any, of the rib wave guide 17 that may be removed can vary depending on the chemistry and etching process used. Regardless, there will be a surface 40 of the wave rib guide that is exposed when forming the window 38. After etching to form the window 38, a conventional wet clean including piranha may be performed.

Figure 7:
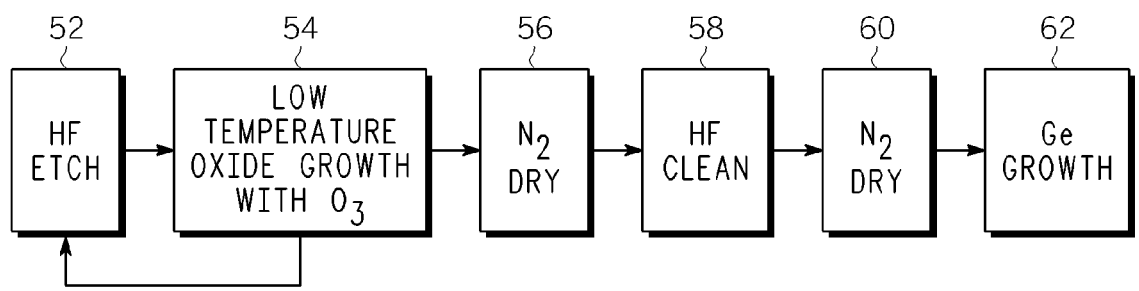
FIG. 7 illustrates a process of forming a clean interface between germanium and silicon in accordance with an embodiment.

After forming the window 38, a cleaning process is performed. The cleaning process 50 illustrated in FIG. 7 is one embodiment of a cleaning process. The cleaning process 50 includes submerging the semiconductor device 10 in a chemistry including hydrogen and fluorine, such as HF (hydrofluoric acid) in the HF etch step 52. The HF removes contaminants from the surface 40 that remain from the etch process used to form the window 38. In one embodiment, the HF used is a dilute HF, such as 0.25 weight percent HF acid.

Figure 3:
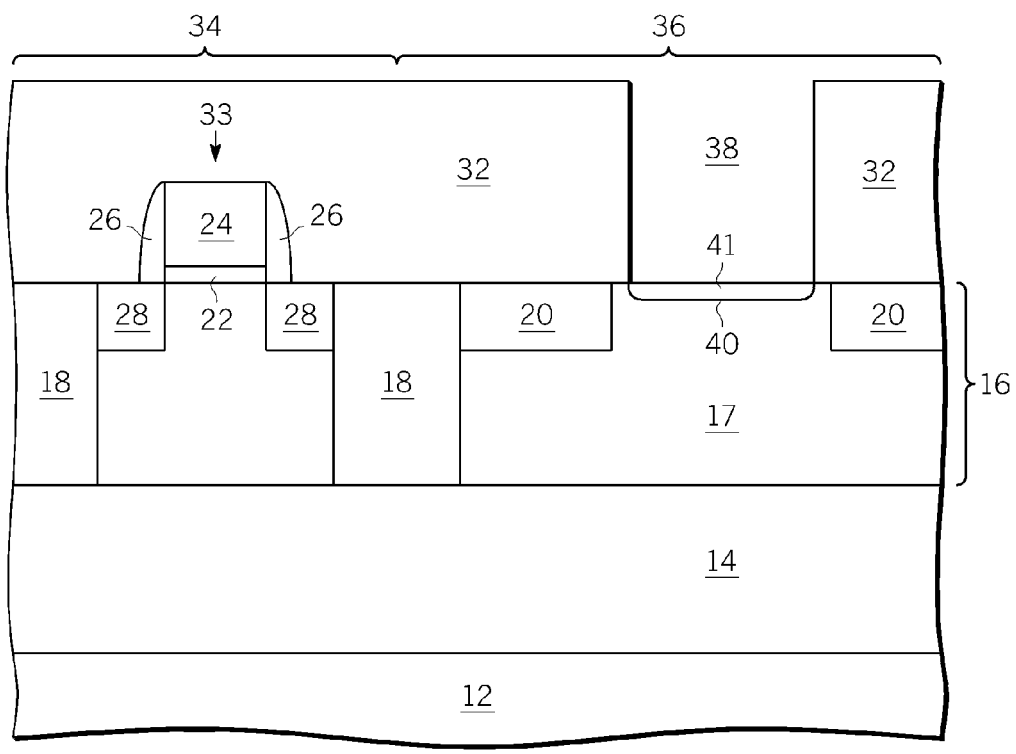
FIG. 3 illustrates the portion of the cross-section of the semiconductor device of FIG. 2 after forming silicon dioxide in accordance with an embodiment.

Afterwards, a low temperature oxide growth is performed over the surface 40 to form silicon dioxide 41, as shown in FIG. 3. The low temperature oxide growth is a wet process. The semiconductor device 10 is transferred from the HF solution to the chemistry used for low temperature oxide growth without exposing the semiconductor device 10 to air. This can be accomplished using a wet bench such as SCP Model ES200 automated wet bench or the like, which allows the chemistry to be brought to the semiconductor device 10. Hence, as will be better understood after further discussion steps 52 and 54 of the cleaning process 50 in FIG. 7 are performed insitu. The low temperature oxide growth occurs at approximately room temperature or below. In one embodiment, the low temperature oxide growth is a room temperature wet growth process. In one embodiment, the growth of silicon dioxide over the surface 40 occurs using ozone with deionized (DI) water, which is created by ozonating DI water. In one embodiment, 4-11 ppm ozone is used in DI water at approximately 23 degrees Celsius. When the silicon dioxide is grown, the inventors believe contaminants, such as carbon, are pulled from the silicon in the rib wave guide 17 and incorporated into the silicon dioxide. The thickness of the silicon dioxide that is formed is approximately 14 Angstroms. One advantage about using ozone is that ozone is self-terminating when it reacts with silicon, thus only a limited amount of silicon dioxide is formed.

Figure 4:
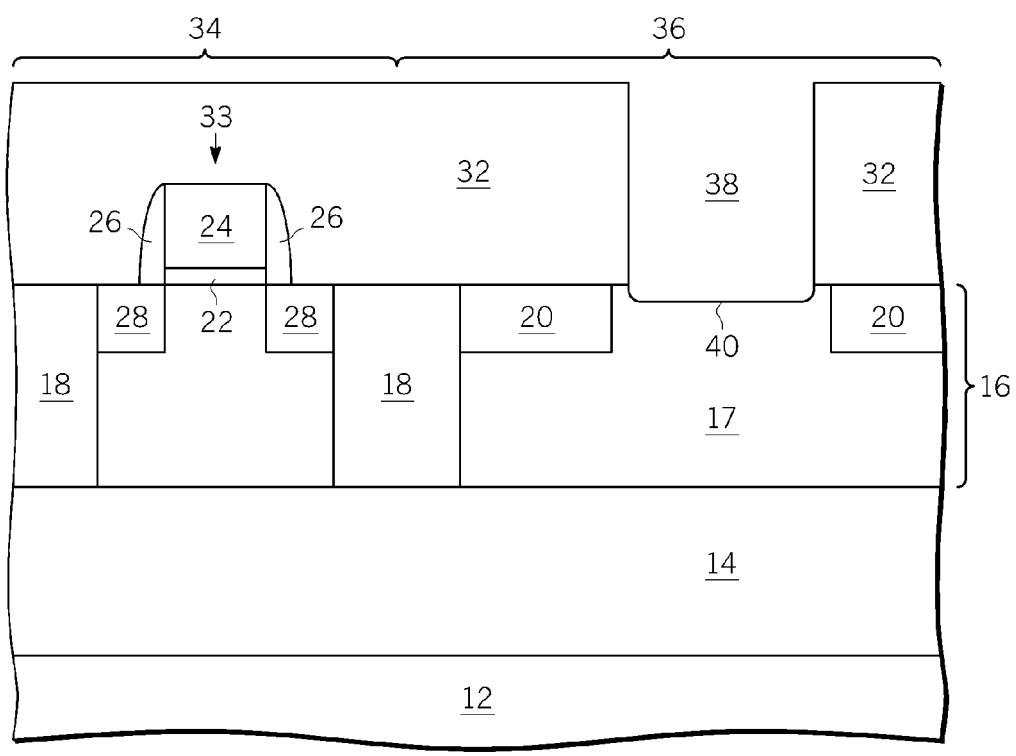
FIG. 4 illustrates the portion of the cross-section of the semiconductor device of FIG. 3 after removing the silicon dioxide in accordance with an embodiment.

After forming the silicon dioxide during the low temperature oxide growth step 54, the HF etch step 52 can be repeated. If the HF etch step 52 is performed after the low temperature oxide growth step 54, the HF etch step 52 will remove substantially all of the silicon dioxide that was grown during the low temperature oxide growth step 54, as shown in FIG. 4. (A skilled artisan appreciates that in some embodiments all of the silicon dioxide is removed, but that in some embodiment due to process issues some silicon dioxide may be present.) In one embodiment, the HF etch step 52 and the low temperature oxide growth step 54 are repeated three times. However, these steps can be repeated any number of times, such as zero to any number (e.g., eight). (In the embodiment, where the steps 52 and 54 are repeated zero times, each step 52 and 54 are formed once and hence they are not repeated.)

After the last low temperature oxide growth 54 step, the semiconductor device 10 is rinsed with water, then isopropol alcohol in vapor is injected into the tank followed by warm nitrogen (e.g., nitrogen at approximately 99-102 degrees Celsius). In one embodiment, the N2 dry step 56 is not performed. In one embodiment, the surface 40 is rinsed with degassed water.

After the N2 dry step 56, if performed, or the low temperature oxide growth step 54, if the N2 dry step 56 is not performed, a clean including hydrogen and fluorine, such as the HF clean step 58 is performed. In one embodiment, the HF clean step 58 includes a higher concentration of HF than the HF etch step 52. The HF clean step 58 terminates and stables silicon bonds on the surface 40. The inventors have discovered that for an unknown reason this HF clean performed after an HF etch step 52 and a low temperature oxide growth step 54, has been more effective at terminating silicon bonds than without the HF etch step 52 and low temperature oxide growth steps 54 being performed. Without performing steps 52 and 54, the silicon bonds are typically only stable for a few hours after an HF clean. However, if steps 52 and 54 are performed, the inventors have found that the silicon bonds are stable for at least 24 hours. Thus, the semiconductor device 10 can sit in air for at least 24 hours before silicon dioxide will undesirably grow on the surface 40. This improves the flexibility of manufacturing as there can be at least 24 hours between the HF clean step 58 and the next process step.

After the HF clean step 58, the semiconductor device 10 may be dried by blowing nitrogen at the semiconductor device 10 during the N2 dry step 60. The N2 dry step 60 can be the same process as that for N2 dry step 56. In one embodiment, the N2 dry step 60 occurs in a closed environment to keep oxygen from being in the ambient and prevent silicon dioxide growth.

Figure 5:
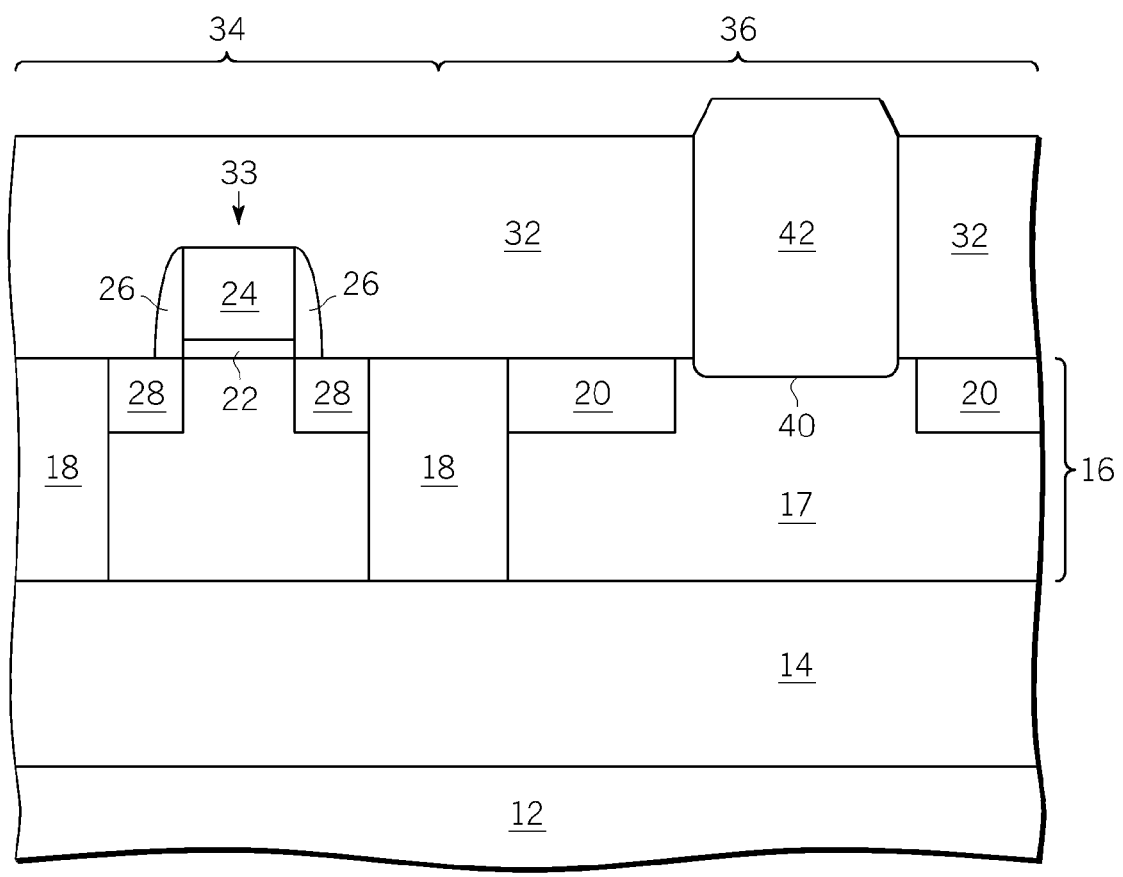
FIG. 5 illustrates the portion of the cross-section of the semiconductor device of FIG. 4 after forming germanium in accordance with an embodiment.

After the N2 dry step 60, a semiconductor material is grown in the window 38, as shown in FIG. 5. In one embodiment, the semiconductor material 42 includes germanium. The semiconductor material is formed by epitaxial growth at a temperature less than 400 degrees Celsius, which in one embodiment is approximately 390 degrees. Because the growth process is a selective epitaxial process, the top of the semiconductor material 42 is slanted inward at the corners. In prior art methods, epitaxial growth includes two steps: i) a high temperature bake at temperatures greater than 750 degrees Celsius; and ii) growth. However, the high temperature bake is herein removed. In one embodiment, instead of a high temperature bake, germane is flowed over the surface 40 at a temperature less than 600 degrees Celsius and then HCl is used to etch the germanium away and further clean the surface. The HCl etch is also performed at less than 600 degrees Celsius. Afterwards, the germanium semiconductor material 42 is grown. A skilled artisan appreciates that while 600 degrees Celsius may currently be the maximum for the germane flow process because the transistor 33 cannot withstand temperatures higher than this, that as processes change it is likely that this maximum temperature will decrease, such as to 500 degrees Celsius or even 400 degrees Celsius. In another embodiment, the germane is not used. Instead, after the N2 dry step 60, germanium 42 is grown without any intervening pretreatment process.

Figure 6:
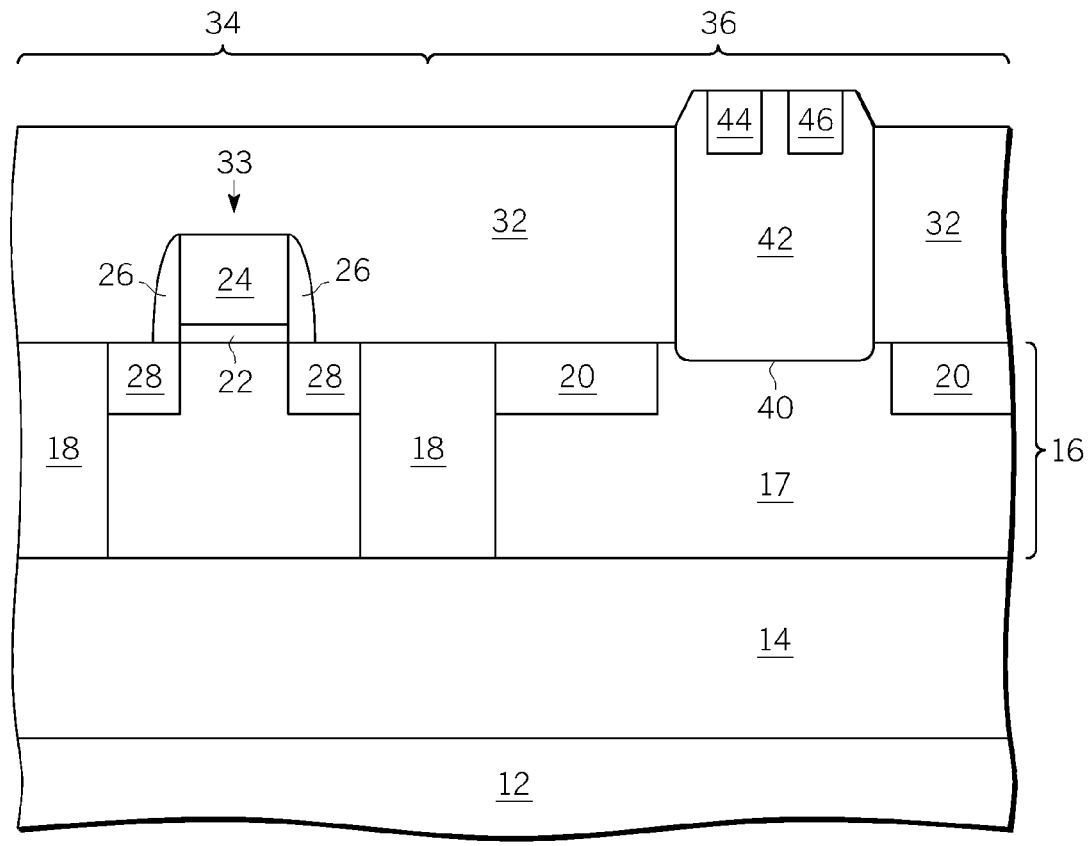
FIG. 6 illustrates the portion of the cross-section of the semiconductor device of FIG. 5 after forming doped regions in accordance with an embodiment.

After forming the semiconductor material 42, the doped regions 44 and 46 are formed in accordance with an embodiment illustrated in FIG. 6. An implant and anneal may be performed to form doped regions 44 and 46 in a portion of the semiconductor material 42. One doped region 44, for example, will be doped N+ and the other doped region 46, for example, P+. Therefore, two mask and implant process may be needed. However, one anneal can be performed after the implant of both the N-type and P-type species, or an anneal can be used following the individual implantation of the N-type and P-type species. In one embodiment, the N-type species is annealed at a temperature between approximately 500 to 600 degrees Celsius, or more specifically 550 to 600 degrees Celsius, and the P-type species is annealed at a temperature between approximately 400 to 600 degrees Celsius. There is more latitude in the annealing temperature for the P-type species if the semiconductor material 42 is germanium than for the N-type species since the P-type species is relatively easy to activate and does not diffuse as much as the N-type species. If only one anneal is being performed to anneal both the N-type and P-type species than a temperature between approximately 500 to 600 degrees can be used.

Various embodiments are discussed below. Embodiment 1 includes a method of forming a semiconductor layer or forming a photodetector, including forming a silicon shape having a top surface that is exposed, applying ozonated water to the top surface to form a first oxide layer on the top surface, removing the first oxide layer at a temperature below 600 degrees Celsius, and epitaxially growing a semiconductor material on the top surface. Embodiment 2 includes the method of embodiment 1, wherein the step of applying ozonated water is further characterized by the temperature being below 600 degrees Celsius. Embodiment 3 includes the method of embodiment 1, further including forming a P type region in the germanium, and forming an N-type region in the germanium, wherein the N-type region is separated from the P-type region. Embodiment 4 includes the method of embodiment 1, further including applying ozonated water to the top surface 40 to form a second oxide layer prior to the step of forming the first oxide layer, and removing the second oxide layer, wherein the steps of applying the ozonated water and removing the first oxide layer are further characterized by the temperatures being below 500 degrees Celsius. Embodiment 5 includes the method of embodiment 4, further including drying the top surface after growing the first oxide layer and before removing the first oxide layer. Embodiment 6 includes the method of embodiment 5 further including drying the top surface after removing the first oxide layer. Embodiment 7 includes the method of embodiment 6, wherein the step of removing the first oxide layer is further characterized by using a wet etchant including hydrofluoric acid, and the semiconductor material includes germanium. Embodiment 8 includes the method of embodiment 1, further including rinsing the top surface with degassed water. Embodiment 9 includes the method of embodiment 1, wherein the step of applying ozonated water to form the first oxide layer includes applying ozonated deionized water to the top surface. Embodiment 10 includes the method of embodiment 1, wherein the top surface is prevented from receiving a temperature in excess of 600 degrees Celsius from the step of growing the first oxide layer through the step of epitaxially growing the semiconductor material. Embodiment 11 includes the method of embodiment 1, wherein the step of forming the first oxide layer is performed at room temperature. Embodiment 12 the method of embodiment 1, wherein the silicon shape is formed from a silicon layer, further including forming a transistor in and on the semiconductor layer. Embodiment 13 includes the method of embodiment 12, further including trench isolation in the semiconductor layer, wherein the trench isolation is between the transistor and the silicon shape. Embodiment 14 includes the method of embodiment 1, wherein the step of forming the silicon shape is further characterized by forming the silicon shape into an inverse-T shape.

Embodiment 15 includes a method of forming a semiconductor layer, including forming a silicon shape having a top surface that is exposed, growing a first oxide layer on the top surface, removing the first oxide layer, growing a second oxide layer on the top surface, removing the second oxide layer, and epitaxially growing germanium on the top surface, wherein all processing of the top surface after the step of growing the first oxide layer occurs at temperatures below 600 degrees Celsius. Embodiment 16 includes the method of embodiment 15, wherein the growing the first oxide layer includes applying ozonated water to the top surface. Embodiment 17 includes the method of embodiment 16, wherein the growing the first oxide layer is further characterized by the ozonated water being deionized. Embodiment 18 includes the method of embodiment 17, further including drying the top surface using nitrogen after applying the ozonated water to form the second oxide layer.

Embodiment 19 includes a method of forming a semiconductor layer, including forming a silicon shape having a top surface that is exposed, applying ozonated deionized water to the top surface to form a first oxide layer on the top surface, removing the first oxide layer using wet hydrofluoric acid, applying ozonated deionized water to the top surface to form a second oxide layer on the top surface, removing the second oxide layer using wet hydrofluoric acid, and epitaxially growing germanium on the top surface. Embodiment 20 includes the method of embodiment 19, further including applying ozonated deionized water to the top surface to form a third oxide layer on the top surface prior to the step of applying ozonated deionized water to form the first oxide layer, and removing the third oxide layer using wet hydrofluoric acid.

Although the invention is described herein with reference to specific embodiments, various modifications and changes can be made without departing from the scope of the present invention as set forth in the claims below. For example, the cleaning process 50 and its various embodiments are not limited to cleaning interfaces between silicon and germanium, especially interfaces used for optical devices, such as photodetectors. The cleaning process 50 can be used in other applications, such as for silicon germanium channels or any other process where it is desirable to have a clean interface so a high quality film is formed (e.g., by epitaxial growth.). Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. A method of forming a semiconductor layer, comprising:
   forming a silicon shape having a top surface that is exposed;
   applying ozonated water to the top surface to form a first oxide layer on the top surface;
   removing the first oxide layer; and
   applying ozonated water to the top surface to form a second oxide layer prior to the step of forming the first oxide layer; and
   removing the second oxide layer;
   epitaxially growing a semiconductor material on the top surface,
   wherein:
      the steps of applying the ozonated water and removing the first oxide layer are performed at temperatures below 500 degrees Celsius; and
      between the steps of removing the first oxide layer and epitaxially growing the semiconductor material, the top surface of the silicon shape is not exposed to a bake at a temperature greater than 750 degrees Celsius.

2. The method of claim 1, wherein the step of applying ozonated water is further characterized by the temperature being below 600 degrees Celsius.

3. The method of claim 1, further comprising:
   forming a P type region in the semiconductor material; and
   forming an N-type region in the semiconductor material, wherein the N-type region is separated from the P-type region.

4. The method of claim 1, further comprising:
   drying the top surface after growing the first oxide layer and before removing the first oxide layer.

5. The method of claim 4 further comprising:
   drying the top surface after removing the first oxide layer.

6. The method of claim 5, wherein:
   the step of removing the first oxide layer is further characterized by using a wet etchant comprising hydrofluoric acid; and
   the semiconductor material comprises germanium.

7. The method of claim 1, further comprising:
   rinsing the top surface with degassed water.

8. The method of claim 1, wherein the step of applying ozonated water to form the first oxide layer comprises applying ozonated deionized water to the top surface.

9. The method of claim 1, wherein the top surface is prevented from receiving a temperature in excess of 600 degrees Celsius from the step of forming the first oxide layer through the step of epitaxially growing the semiconductor material.

10. The method of claim 1, wherein the step of forming the first oxide layer is performed at room temperature.

11. The method of claim 1, wherein the silicon shape is formed from a silicon layer, further comprising forming a transistor in and on the semiconductor layer.

12. The method of claim 11, further comprising trench isolation in the semiconductor layer, wherein the trench isolation is between the transistor and the silicon shape.

13. The method of claim 1, wherein the step of forming the silicon shape is further characterized by forming the silicon shape into an inverse-T shape.

14. A method of forming a semiconductor layer, comprising:
   forming a silicon shape having a top surface that is exposed;
   growing a first oxide layer on the top surface;
   removing the first oxide layer;
   growing a second oxide layer on the top surface;
   removing the second oxide layer; and
   epitaxially growing germanium on the top surface,
   wherein all processing of the top surface after the step of growing the first oxide layer occurs at temperatures below 600 degrees Celsius.

15. The method of claim 14, wherein the growing the first oxide layer comprises applying ozonated water to the top surface.

16. The method of claim 15, wherein the growing the first oxide layer is further characterized by the ozonated water being deionized.

17. The method of claim 16, further comprising drying the top surface using nitrogen after applying the ozonated water to form the second oxide layer.

18. A method of forming a semiconductor layer, comprising:
   forming a silicon shape having a top surface that is exposed;
   applying ozonated deionized water to the top surface to form a first oxide layer on the top surface;
   removing the first oxide layer using wet hydrofluoric acid;
   applying ozonated deionized water to the top surface to form a second oxide layer on the top surface;
   removing the second oxide layer using wet hydrofluoric acid; and
   epitaxially growing germanium on the top surface.

19. The method of claim 18, further comprising:
   applying ozonated deionized water to the top surface to form a third oxide layer on the top surface prior to the step of applying ozonated deionized water to form the first oxide layer; and
   removing the third oxide layer using wet hydrofluoric acid.

* * * * *